(12) United States Patent
Kim et al.

(10) Patent No.: US 11,287,343 B2
(45) Date of Patent: Mar. 29, 2022

(54) PRESSURE SENSOR HAVING UNEVENNESS AND MANUFACTURING METHOD THEREFOR

(71) Applicant: FOUNDATION OF SOONGSIL UNIVERSITY INDUSTRY COOPERATION, Seoul (KR)

(72) Inventors: Joo Yong Kim, Seoul (KR); Min Ki Choi, Incheon (KR)

(73) Assignee: FOUNDATION OF SOONGSIL UNIVERSITY INDUSTRY COOPERATION, Seoul (KR)

(*) Notice: Subject to any disclaimer, the term of this patent is extended or adjusted under 35 U.S.C. 154(b) by 168 days.

(21) Appl. No.: 16/616,685

(22) PCT Filed: Feb. 6, 2018

(86) PCT No.: PCT/KR2018/001596
§ 371 (c)(1),
(2) Date: Nov. 25, 2019

(87) PCT Pub. No.: WO2019/059469
PCT Pub. Date: Mar. 28, 2019

(65) Prior Publication Data
US 2020/0209088 A1 Jul. 2, 2020

(30) Foreign Application Priority Data
Sep. 20, 2017 (KR) .................. 10-2017-0121132

(51) Int. Cl.
*G01L 13/02* (2006.01)
*H01L 41/113* (2006.01)
(52) U.S. Cl.
CPC .......... *G01L 13/02* (2013.01); *H01L 41/1132* (2013.01)

(58) Field of Classification Search
CPC ................. G01L 13/02; H01L 41/1132
(Continued)

(56) References Cited

U.S. PATENT DOCUMENTS 7,295,724 B2 * 11/2007 Wang ............... G01L 1/246
385/13
7,645,398 B2 * 1/2010 Kim ................. G01L 1/205
252/500

(Continued)

FOREIGN PATENT DOCUMENTS

EP     2899521 B1    8/2017
KR  10-1554543 B1    9/2015

OTHER PUBLICATIONS

Cho-Long Jung et al., "The biomimetic skin-type tactile sensor", 2016 The Korean Society of Mechanical Engineers Conference, Dec. 2016, p. 3081-3082, The Korean Society of Mechanical Engineers, Republic of Korea, cited in NPL No. 2 with English Abstract.

(Continued)

*Primary Examiner* — Nathaniel T Woodward
(74) *Attorney, Agent, or Firm* — Hauptman Ham, LLP

(57) ABSTRACT

A pressure sensor having unevenness and a manufacturing method therefor are disclosed. The disclosed pressure sensor senses pressure in a vertical direction and includes a first pressure sensor unit and a second pressure sensor unit, wherein the first pressure sensor unit and the second pressure sensor unit are stacked, and unevenness is formed on the upper surface of the first pressure sensor unit and on the lower surface of the second pressure sensor unit.

7 Claims, 6 Drawing Sheets

(58) Field of Classification Search
USPC .......................................................... 73/715
See application file for complete search history.

(56) References Cited

U.S. PATENT DOCUMENTS

| | | | | |
|---|---|---|---|---|
| 8,943,897 | B2* | 2/2015 | Beauvais | A61B 5/1126 |
| | | | | 73/777 |
| 9,841,331 | B2* | 12/2017 | Wood | G06F 3/014 |
| 10,151,649 | B2* | 12/2018 | Lewis | G01L 1/20 |
| 10,267,690 | B2* | 4/2019 | Wu | G01L 1/146 |
| 10,473,539 | B2* | 11/2019 | Podoloff | G01L 1/2287 |
| 2002/0194919 | A1 | 12/2002 | Lee et al. | |
| 2013/0205908 | A1 | 8/2013 | Hsu et al. | |
| 2014/0090489 | A1* | 4/2014 | Taylor | G01L 1/00 |
| | | | | 73/862.626 |
| 2017/0363489 | A1* | 12/2017 | Haick | G01L 1/18 |
| 2018/0246000 | A1* | 8/2018 | Kim | G01L 9/0044 |
| 2018/0303383 | A1* | 10/2018 | Connor | G06F 3/011 |

OTHER PUBLICATIONS

International Search Report dated Jun. 27, 2018 for corresponding international application No. PCT/KR2018/001596.

\* cited by examiner

FIG. 1
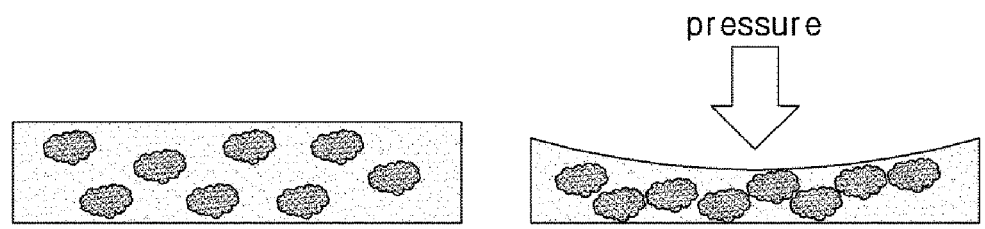
(a)
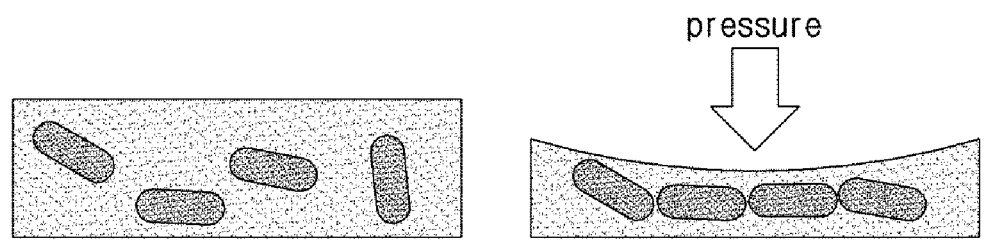
(b)

PRESSURE SENSOR HAVING UNEVENNESS AND MANUFACTURING METHOD THEREFOR

CROSS-REFERENCE TO RELATED APPLICATION

The present application is a national stage filing under 35 U.S.C § 371 of PCT application number PCT/KR2018/001596 filed on Feb. 6, 2018 which is based upon and claims the benefit of priority to Korean Patent Application No. 10-2017-0121132, filed on Sep. 20, 2017, in the Korean Intellectual Property Office, which is incorporated herein in its entirety by reference.

BACKGROUND

1. Technical Field

Embodiments of the present invention relate to a pressure sensor and a method for manufacturing the pressure sensor, in which pressure sensor units formed with unevenness are stacked in multiple layers to implement a varied detection performance.

2. Description of the Related Art

A pressure sensor is a device for sensing a pressure in a vertical direction, and there are various types according to the principle used for measuring the pressure, with examples including the piezoresistive pressure sensor, piezoelectric pressure sensor, capacitive pressure sensor, textile pressure sensor, etc. In particular, in the pressure sensor that uses rubber (hereinafter referred to as a "rubber pressure sensor"), conductive particles included in the rubber move to generate a change in the electrical signal, and the pressure sensor senses pressure by monitoring such change.

With the rubber pressure sensor, the pressure sensitivity may be adjusted according to the elastic coefficient (modulus) or the amount of conductive particles included in the rubber. That is, a lower elastic coefficient or a larger amount of conductive particles provide a higher pressure sensitivity, while a higher elastic coefficient or a smaller amount of conductive particles provide a lower pressure sensitivity. This is as illustrated in FIG. 1.

Here, a rubber pressure sensor having a low elastic coefficient or a large amount of conductive particles (drawing (a) of FIG. 1) is a sensor having a high sensitivity, and the minimum detectable pressure and maximum detectable pressure are low. In other words, a rubber pressure sensor having a high pressure sensitivity is able to react to low pressures but unable to react to high pressures.

Also, a rubber pressure sensor having a high elastic coefficient or a small amount of conductive particles (drawing (b) of FIG. 1) is a sensor having a low sensitivity, and the minimum detectable pressure and maximum detectable pressure are high. In other words, a rubber pressure sensor having a low pressure sensitivity is able to react to high pressures but unable to react to low pressures.

Thus, a single-layer rubber pressure sensor according to the related art described above can have the minimum detectable pressure and the maximum detectable pressure both set low (drawing (a) of FIG. 1) or have the minimum detectable pressure and the maximum detectable pressure both set high (drawing (b) of FIG. 1), so that the range of detectable pressures is limited.

SUMMARY OF THE INVENTION

To resolve the problem of the related art described above, an aspect of the present invention proposes a pressure sensor and a manufacturing method for the pressure sensor, in which pressure sensor units formed with unevenness are stacked in multiple layers to implement a varied detection performance.

Other objectives of the present invention can be derived by the skilled person from the embodiments set forth below.

A preferred embodiment of the present invention, conceived to achieve the objectives above, provides a pressure sensor for sensing a pressure in a vertical direction that includes a first pressure sensor unit and a second pressure sensor unit, where the first pressure sensor unit and the second pressure sensor unit are stacked, and unevenness is formed in an upper surface of the first pressure sensor unit and a lower surface of the second pressure sensor unit.

Another embodiment of the present invention provides a pressure sensor for sensing a pressure in a vertical direction that includes an N (integer greater than or equal to 3) number of pressure sensor units stacked in N or more layers, where unevenness is formed in the an upper surface of a pressure sensor unit at the lowermost layer, a lower surface of a pressure sensor unit at the uppermost layer, and an upper surface and a lower surface of the remaining pressure sensor units other than the pressure sensor unit at the lowermost layer and the pressure sensor unit at the uppermost layer from among the N number of pressure sensor units.

Yet another embodiment of the present invention provides a method for manufacturing a pressure sensor configured to sense a pressure in a vertical direction. The method includes: forming unevenness in at least one of an upper surface and a lower surface of a multiple number of pressure sensor units; and stacking the multiple number of pressure sensor units in which the unevenness has been formed, where the unevenness includes convex areas and concave areas, pressure sensor unit A and pressure sensor unit B from among the multiple pressure sensor units are adjacent, a convex area of pressure sensor unit A is inserted into a corresponding concave area of pressure sensor unit B, and a convex area of pressure sensor unit B is inserted into a corresponding concave area of pressure sensor unit A.

A pressure sensor based on the present invention provides the advantage that a varied detection performance can be implemented.

It should be appreciated that the effects of the present invention are not limited to the effect described above but rather encompass all effects that can be derived from the composition of the present invention as disclosed in the detailed description or the scope of claims.

BRIEF DESCRIPTION OF THE DRAWINGS

FIG. 1 illustrates the concept of a rubber pressure sensor according to the related art.

DETAILED DESCRIPTION OF THE INVENTION

In the present specification, an expression used in the singular encompasses the expression of the plural, unless it has a clearly different meaning in the context. In the present specification, terms such as "composed of" or "including," etc., are not to be interpreted as meaning that the several elements or steps mentioned thereafter must necessarily be included. Rather, such disclosure should be interpreted to mean that some of the elements or steps may not be included, while other additional elements or steps may further be included. A term such as "unit," "module," etc., disclosed in the specification represents a unit by which at least one function or operation is processed, where this can be implemented as hardware or software or a combination of hardware and software.

Various embodiments of the present invention are described below in more detail with reference to the accompanying drawings.

Figure 2:
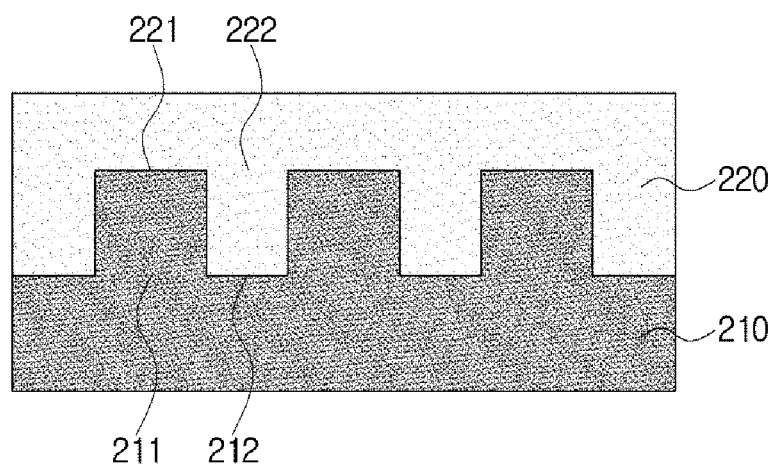
FIG. 2 conceptually illustrates the composition of a pressure sensor according to an embodiment of the present invention.

FIG. 2 conceptually illustrates the composition of a pressure sensor according to an embodiment of the present invention.

Referring to FIG. 2, a pressure sensor 200 according to an embodiment of the present invention may be a sensor that senses a pressure in a vertical direction, can be used in wearable device products (shoes, clothes, bedding, etc.), biosensors, etc., and may include a first pressure sensor unit 210 and a second pressure sensor unit 220.

The first pressure sensor unit 210 may be a single-layer pressure sensor and may be arranged at a first layer of the pressure sensor 200. The second pressure sensor unit 220 may also be a single-layer pressure sensor and may be arranged at a second layer of the pressure sensor 200. That is, a pressure sensor 200 according to an embodiment of the present invention may have a structure in which two different pressure sensor units 210, 220 are stacked together.

Here, the materials for the first pressure sensor unit 210 and the second pressure sensor unit 220 can be rubber that includes conductive particles. However, the materials for the pressure sensor units 210, 220 are not thus limited, and pressure sensor units 210, 220 having various materials can be used. For the sake of convenience, the following descriptions will assume that the first pressure sensor unit 210 the second pressure sensor unit 220 are of rubber materials.

The first pressure sensor unit 210 and the second pressure sensor unit 220 may have elastic coefficients (moduli) of specific values. A low elastic coefficient and a high drape property may provide a high pressure sensitivity, whereas a high elastic coefficient and a low drape property may provide a low pressure sensitivity.

According to an embodiment of the present invention, the elastic coefficient of the first pressure sensor unit 210 and the elastic coefficient of the second pressure sensor unit 220 can be different from each other. This provides the advantage of increasing the detection range of the pressure sensor 200.

To be more specific, the first pressure sensor unit 210 can be a single-layer pressure sensor having an elastic coefficient of a first value, and the second pressure sensor unit 220 can be a single-layer pressure sensor having an elastic coefficient of a second value that is smaller than the first value. That is, the elastic coefficient of the first pressure sensor unit 210 can be greater than the elastic coefficient of the second pressure sensor unit 220.

Figure 3:
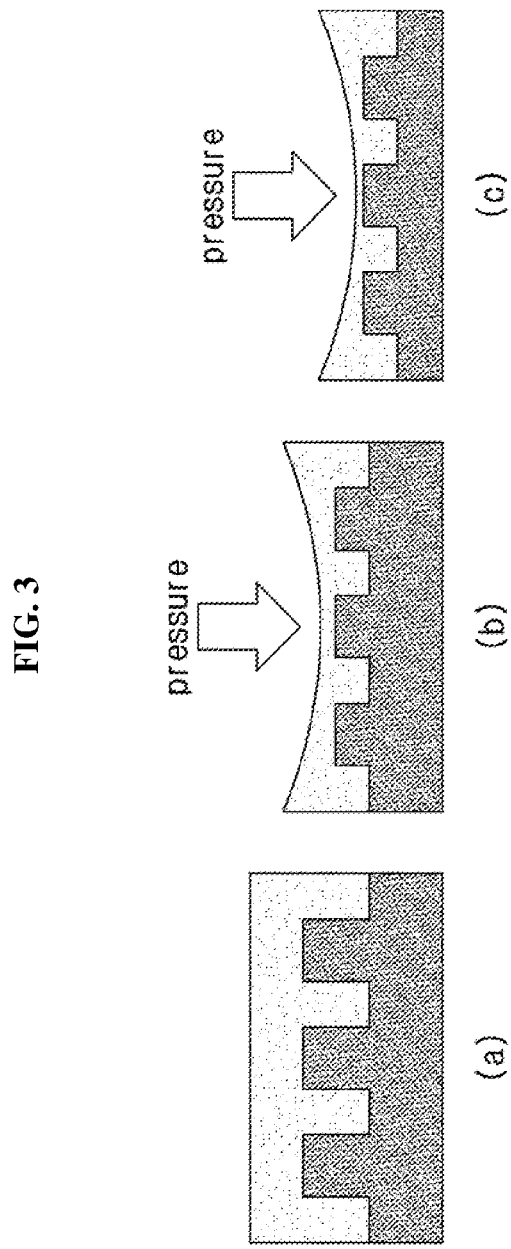
FIG. 3 conceptually illustrates the operation of a pressure sensor according to an embodiment of the present invention.

In other words, referring to FIG. 3, for a multi-layered pressure sensor 200 formed by stacking a pressure sensor having a low elastic coefficient at an upper position and stacking a pressure sensor having a high elastic coefficient at a lower position (drawing (a) of FIG. 3), when a minimum pressure is applied on the pressure sensor 200, then the pressure sensor having the low elastic coefficient (i.e. the second pressure sensor unit 220) may detect the pressure change and enable the sensor to respond (drawing (b) of FIG. 3), and when a maximum pressure is applied on the pressure sensor 200, then the pressure sensor having the low elastic coefficient (i.e. the second pressure sensor unit 220) and the pressure sensor having the high elastic coefficient (i.e. the first pressure sensor unit 210) may both detect the pressure change (drawing (c) of FIG. 3). Thus, the pressure sensor 200 can be made able to detect both the minimum pressure and the maximum pressure (multi-sensor), providing a wider range of pressure detection compared to the single-layer pressure sensor.

That is, by stacking single-layer pressure sensors having different pressure sensitivity levels to manufacture one pressure sensor, it is possible to fabricate a highly efficient sensor of which the resistance changes in response to a minimum pressure and in response to a maximum pressure. Also, by stacking single-layer pressure sensors according to the range of performance required by the user, it is possible to fabricate a customized pressure sensor.

Also, according to an embodiment of the present invention, unevenness can be formed in the upper surface of the first pressure sensor unit 210 and in the lower surface of the second pressure sensor unit 220. This is as illustrated in FIG. 2 and FIG. 3.

To be more specific, the unevenness formed in the upper surface of the first pressure sensor unit 210 may include at least one first convex area 211 and at least one first concave area 212, and the unevenness formed in the lower surface of the second pressure sensor unit 220 may include at least one second convex area 221 and at least one second concave area 222. Here, each of the at least one first convex area 211 can be inserted into a corresponding one of the at least one second concave area 222, and each of the at least one second convex area 221 can be inserted into a corresponding one of the at least one first concave area 212.

Figure 4:
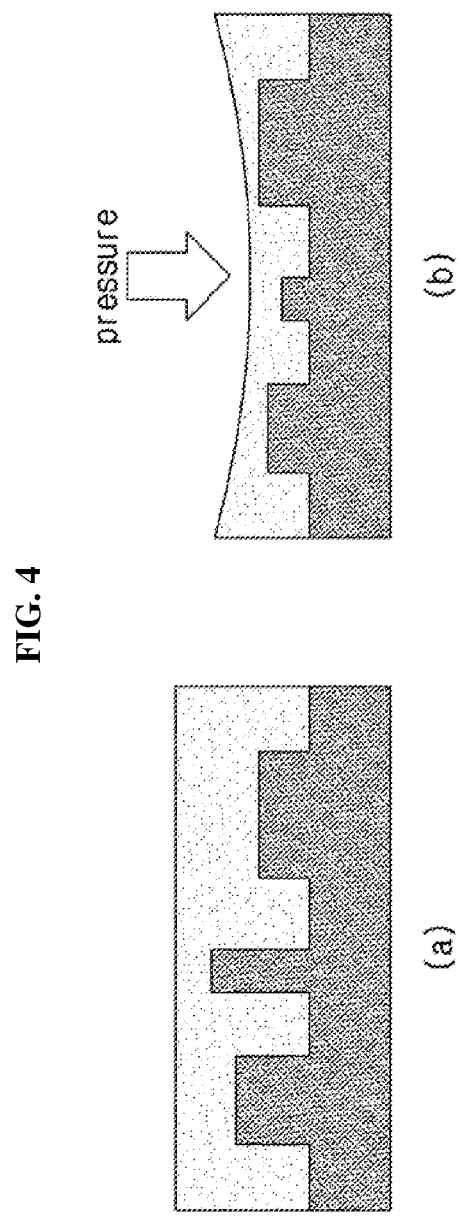
FIG. 4 and FIG. 5 conceptually illustrate the composition of a pressure sensor according to another embodiment of the present invention.

The sizes of the at least one first convex areas 211 (i.e. lengths, widths, heights) and the sizes of the corresponding second concave areas 222 can be the same but also can be different. Similarly, the sizes of the at least one second convex areas 221 and the sizes of the corresponding first concave areas 212 can be the same but also can be different. This is as illustrated in FIG. 4.

By stacking the pressure sensor units 210, 220 that have the same or different unevenness formed on the contacting surfaces, a pressure sensor 200 according to an embodiment of the present invention provides the advantage of enabling an adjustment of the performance of the sensor.

That is, when a pressure is applied on the pressure sensor 200, cases where the unevenness formed in the first pressure sensor unit 210 and the unevenness formed in the second pressure sensor unit 220 have constant sizes can provide the same performance as a pressure sensor formed by stacking two pressure sensor units on which unevenness is not formed. However, cases where the unevenness formed in the first pressure sensor unit 210 and second pressure sensor unit 220 have different shapes allow the measuring of pressure values in a range different from that of the pressure sensor formed by stacking two pressure sensor units on which unevenness is not formed. For instance, if the unevenness formed in the first pressure sensor unit 210 is long or thin, this would allow deformations to occur more easily compared to unevenness having constant sizes, whereas if the unevenness is wide and thick, deformations would not occur as easily, so that the shapes of the unevenness can enable measurements of different pressure ranges. Therefore, by adjusting the shapes of the unevenness, a pressure sensor 200 of a desired performance may be fabricated according to the performance range required by the consumer (to provide a customized pressure sensor).

The features described above can also applied to a pressure sensor formed by stacking three or more single-layer pressure sensor units.

Figure 5:
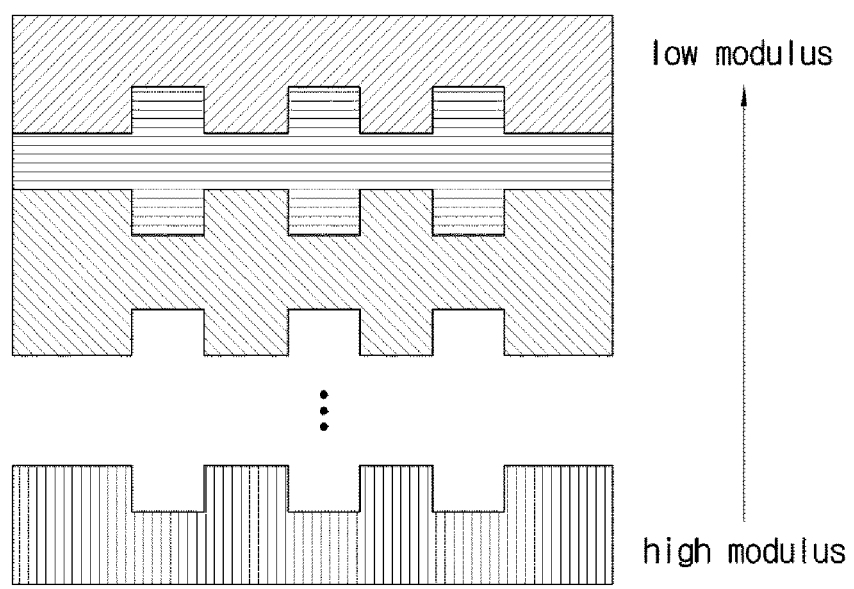

FIG. 5 illustrates a pressure sensor that includes an N number of pressure sensor units (where N is an integer greater than or equal to 3) stacked in an N number of layers.

Referring to FIG. 5, the N number of pressure sensor units can each have a different elastic coefficient. In this case, the stacking order of the N pressure sensor units can be determined based on the values of the elastic coefficients. For instance, FIG. 5 illustrates an example of stacking a multiple number of pressure sensor units from highest to lowest elastic coefficient of the pressure sensor units. That is, the pressure sensor unit of the highest layer among the N number of pressure sensor units can have the highest elastic coefficient, the pressure sensor unit of the lowest layer among the multiple pressure sensor units can have the lowest elastic coefficient, and thus the multiple pressure sensor units can be stacked in descending order of elastic coefficient value with respect to the pressure sensor unit of the highest layer.

Also, unevenness can be formed in the upper surface of the pressure sensor unit at the lowermost layer among the N number of pressure sensor units, in the lower surface of the pressure sensor unit at the uppermost layer, and in the upper surfaces and the lower surfaces of the remaining pressure sensor units other than the pressure sensor unit of the lowermost layer and the pressure sensor unit of the uppermost layer.

Figure 6:
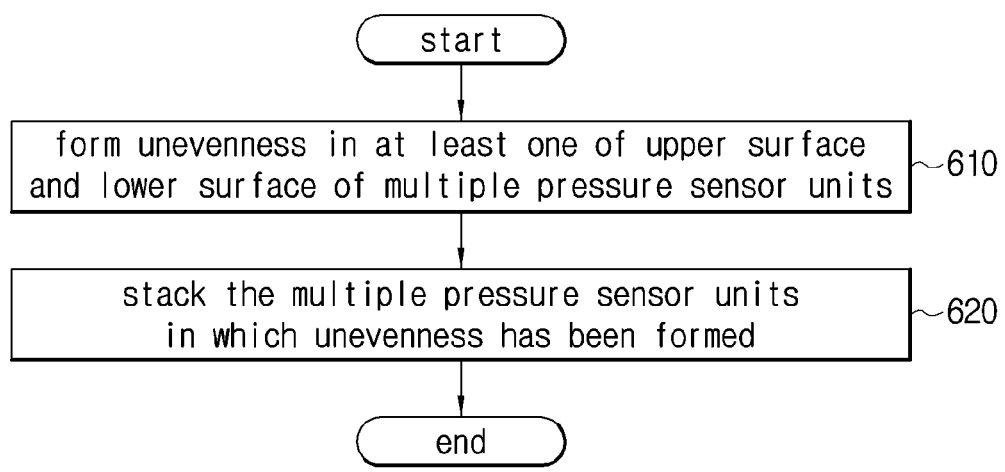
FIG. 6 is a flowchart of a method for manufacturing a pressure sensor according to an embodiment of the present invention.

FIG. 6 is a flowchart of a method for manufacturing a pressure sensor according to an embodiment of the present invention. The procedures performed at each operation are described below.

First, in operation 610, unevenness may be formed in at least one of an upper surface and a lower surface of a multiple number of pressure sensor units.

For example, if there are two pressure sensor units, then the unevenness can be formed in an upper surface of the bottom pressure sensor unit and in a lower surface of the top pressure sensor unit. Here, the sizes of the unevenness can be different.

In another example, if there are three pressure sensor units, then the unevenness can be formed in an upper surface of the bottom pressure sensor unit, in a lower surface of the top pressure sensor unit, and in both an upper surface and a lower surface of the middle pressure sensor unit. Here, the sizes of the unevenness can be different.

Next, in operation 620, the multiple number of pressure sensor units in which unevenness has been formed may be stacked together.

According to an embodiment of the present invention, the unevenness formed in each of the multiple pressure sensor units can include convex areas and concave areas. Also, from among the multiple pressure sensor units, pressure sensor unit A and pressure sensor unit B may be adjacent, and a convex area of pressure sensor unit A can be inserted into a corresponding concave area of pressure sensor unit B, while a convex area of pressure sensor unit B can be inserted into a corresponding concave area of pressure sensor unit A.

The foregoing describes embodiments of a method for manufacturing a pressure sensor based on the present invention, and features of the pressure sensor 200 described above with reference to FIG. 2 to FIG. 5 can also be applied to these embodiments. As such, further details are omitted.

While the present invention has been described above using particular examples, including specific elements, by way of limited embodiments and drawings, it is to be appreciated that these are provided merely to aid the overall understanding of the present invention, the present invention is not to be limited to the embodiments above, and various modifications and alterations can be made from the disclosures above by a person having ordinary skill in the technical field to which the present invention pertains. Therefore, the spirit of the present invention must not be limited to the embodiments described herein, and the scope of the present invention must be regarded as encompassing not only the claims set forth below, but also their equivalents and variations.

What is claimed is:

1. A pressure sensor for sensing a pressure in a vertical direction, the pressure sensor comprising:
    a first pressure sensor unit configured to detect a first pressure; and
    a second pressure sensor unit configured to detect a second pressure independently from the first pressure sensor unit,
    wherein
    the first pressure sensor unit and the second pressure sensor unit are stacked,
    an upper surface of the first pressure sensor unit and a lower surface of the second pressure sensor unit have unevenness formed therein,
    at least one of an elastic coefficient and an amount of conductive particles per unit area is different between the first pressure sensor unit and the second pressure sensor unit,
    an unevenness formed on the upper surface of the first pressure sensor unit includes at least one first convex area and at least one first concave area, and an unevenness formed on the lower surface of the second pressure sensor unit includes at least one second convex area and at least one second concave area, and
    each of the at least one first convex area is inserted into a corresponding one of the at least one second concave area, and each of the at least one second convex area is inserted into a corresponding one of the at least one first concave area.

2. The pressure sensor of claim 1, wherein the at least one first convex area and the at least one second convex area have different sizes from each other.

3. The pressure sensor of claim 1, wherein an elastic coefficient of the second pressure sensor unit is lower than an elastic coefficient of the first pressure sensor unit, and an amount of conductive particles per unit area of the second pressure sensor unit is greater than an amount of conductive particles per unit area of the first pressure sensor unit.

4. The pressure sensor of claim 1, wherein each of the first pressure sensor unit and the pressure sensor unit is of a conductive rubber material.

5. A pressure sensor for sensing a pressure in a vertical direction, the pressure sensor comprising:

an N (integer greater than or equal to 3) number of pressure sensor units stacked in N or more layers, the pressure sensor units each configured to detect a pressure independently, wherein an upper surface of a pressure sensor unit at a lowermost layer, a lower surface of a pressure sensor unit at an uppermost layer, and an upper surface and a lower surface of remaining pressure sensor units other than the pressure sensor unit at the lowermost layer and the pressure sensor unit at the uppermost layer, from among the N number of pressure sensor units, have unevenness formed therein, and wherein the unevenness comprises a convex area and a concave area, pressure sensor unit A and pressure sensor unit B from among the plurality of pressure sensor units are adjacent, a convex area of said pressure sensor unit A is inserted into a corresponding concave area of said pressure sensor unit B, and a convex area of said pressure sensor unit B is inserted into a corresponding concave area of said pressure sensor unit A.

6. The pressure sensor of claim 5, wherein the N number of pressure sensor units have different elastic coefficients, a stacking order is determined with respect to a value of the elastic coefficients, and the plurality of pressure sensor units are stacked in order of largest to smallest value of the elastic coefficients of the N number of pressure sensor units.

7. A method for manufacturing a pressure sensor configured to sense a pressure in a vertical direction, the method comprising:

forming unevenness in at least one of an upper surface and a lower surface of a plurality of pressure sensor units, the pressure sensor units each configured to detect a pressure independently; and stacking the plurality of pressure sensor units having the unevenness formed therein, wherein the unevenness comprises a convex area and a concave area, pressure sensor unit A and pressure sensor unit B from among the plurality of pressure sensor units are adjacent, a convex area of said pressure sensor unit A is inserted into a corresponding concave area of said pressure sensor unit B, and a convex area of said pressure sensor unit B is inserted into a corresponding concave area of said pressure sensor unit A.

* * * * *